(12) United States Patent
Hsieh et al.

(10) Patent No.: US 6,207,503 B1
(45) Date of Patent: Mar. 27, 2001

(54) METHOD FOR SHRINKING ARRAY DIMENSIONS OF SPLIT GATE FLASH MEMORY DEVICE USING MULTILAYER ETCHING TO DEFINE CELL AND SOURCE LINE

(75) Inventors: Chia-Ta Hsieh, Tainan; Yai-Fen Lin, Taichung; Hung-Cheng Sung; Di-Son Kuo, both of Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/133,970

(22) Filed: Aug. 14, 1998

(51) Int. Cl.$^7$ ................................................. H01L 21/336
(52) U.S. Cl. ........................ 438/263; 438/261; 438/264; 438/283
(58) Field of Search .................... 438/263, 261, 438/264, 283

(56) References Cited

U.S. PATENT DOCUMENTS

| | | | |
|---|---|---|---|
| 5,102,814 | * 4/1992 | Woo | 437/43 |
| 5,103,274 | 4/1992 | Tang et al. | 357/23.5 |
| 5,120,671 | 6/1992 | Tang et al. | 437/43 |
| 5,534,455 | 7/1996 | Liu | 437/43 |
| 5,536,668 | * 7/1996 | An et al. | 437/43 |

* cited by examiner

Primary Examiner—Long Pham
Assistant Examiner—Neal Berezny
(74) Attorney, Agent, or Firm—George O. Saile; Stephen B. Ackerman; Graham S. Jones, II

(57) ABSTRACT

A method of forming split gate electrode MOSFET devices comprises the following steps. Form a tunnel oxide layer over a semiconductor substrate. Form a floating gate electrode layer over the tunnel oxide layer. Form a masking cap over the floating gate electrode layer. Pattern a gate electrode stack formed by the tunnel oxide layer and the floating gate electrode layer in the pattern of the masking cap. Form intermetal dielectric and control gate layers over the substrate covering the stack and the source regions and the drain regions. Pattern the intermetal dielectric and control gate layers into adjacent mirror image split gate electrode pairs. Pattern a source line slot in the center of the gate electrode stack down to the substrate. Form source regions through the source line slot. Form drain regions self-aligned with the split gate electrodes and the gate electrode stack.

10 Claims, 11 Drawing Sheets

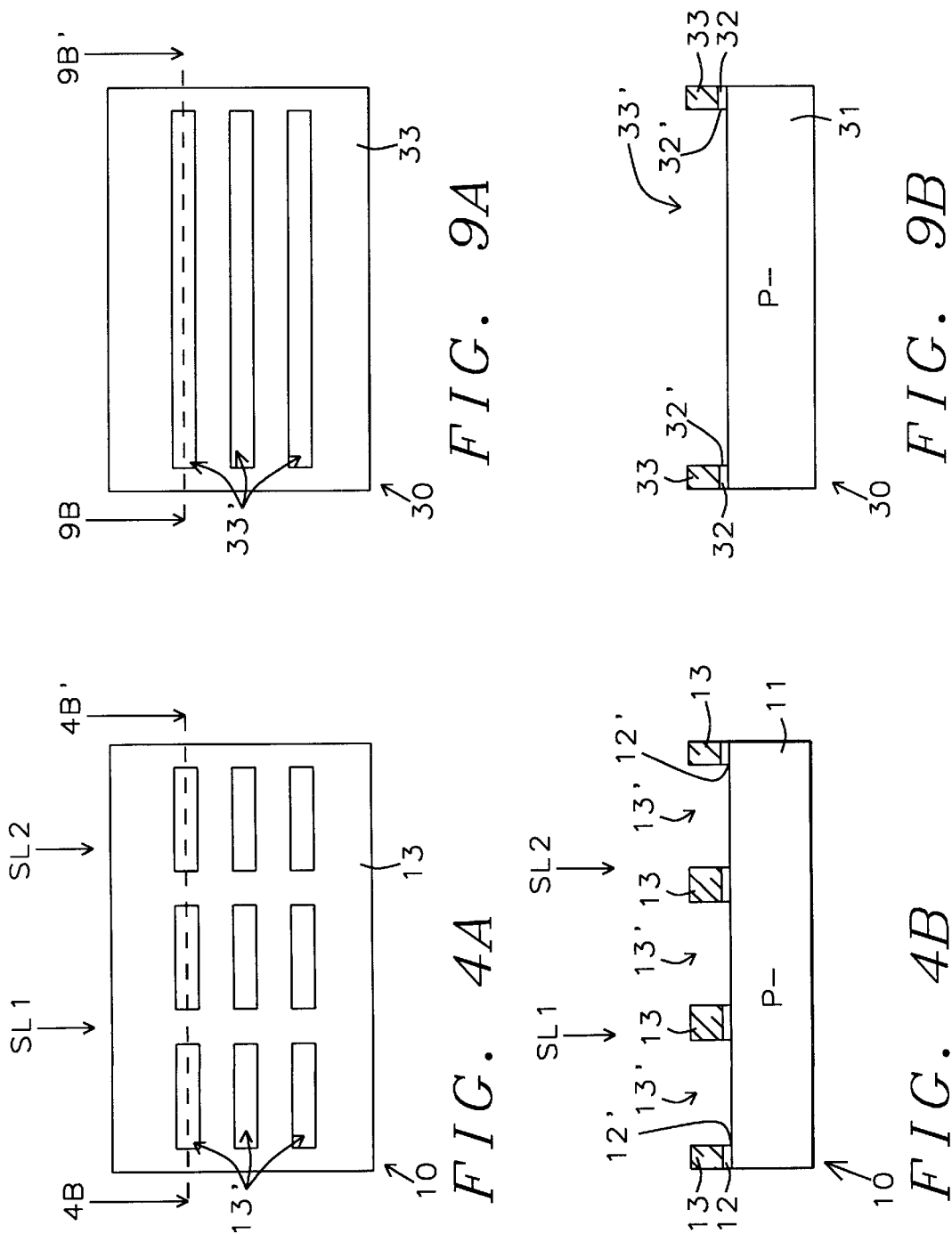

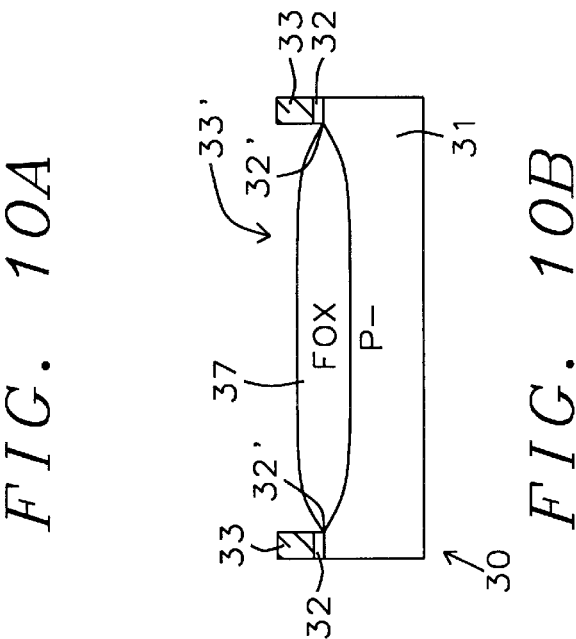
FIG. 10A
FIG. 10B
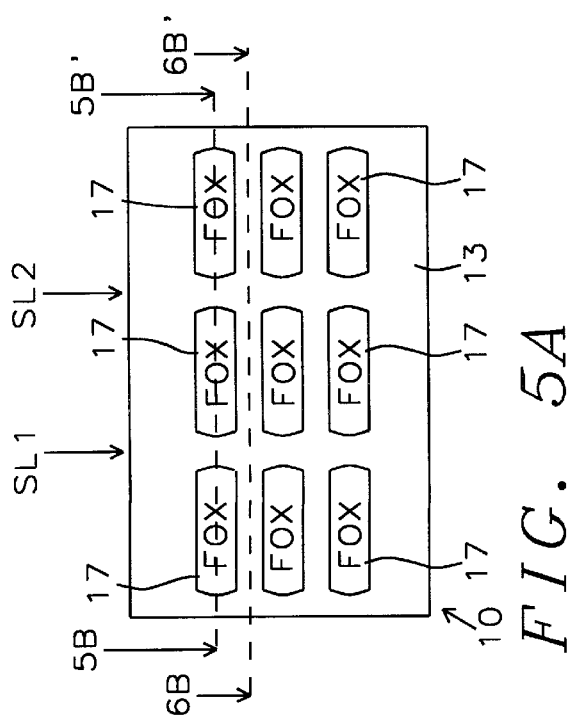
FIG. 5A
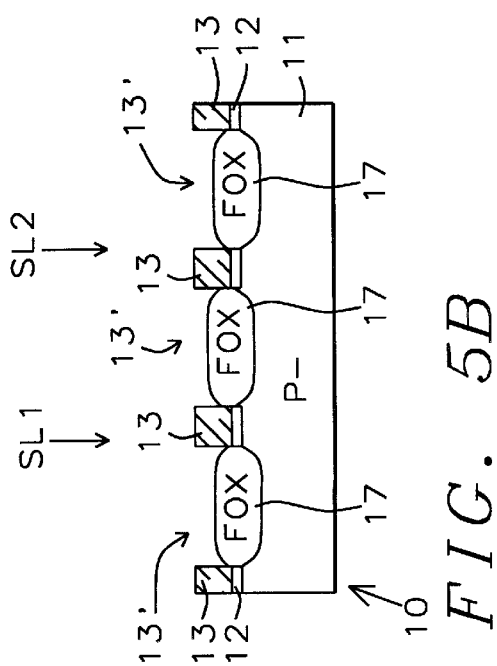
FIG. 5B

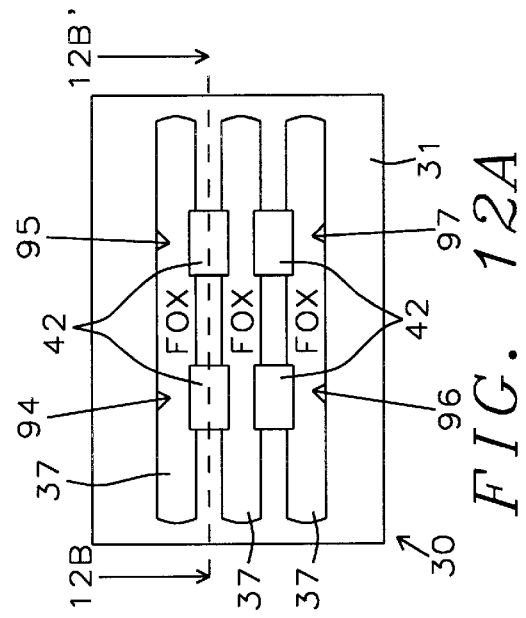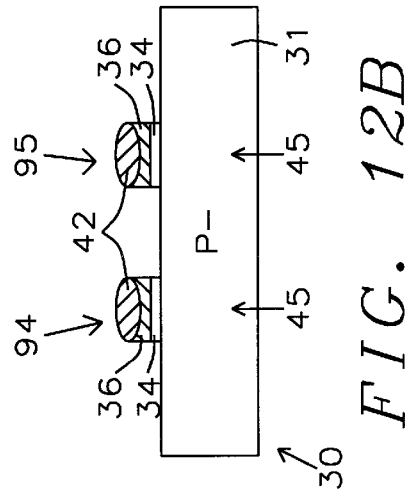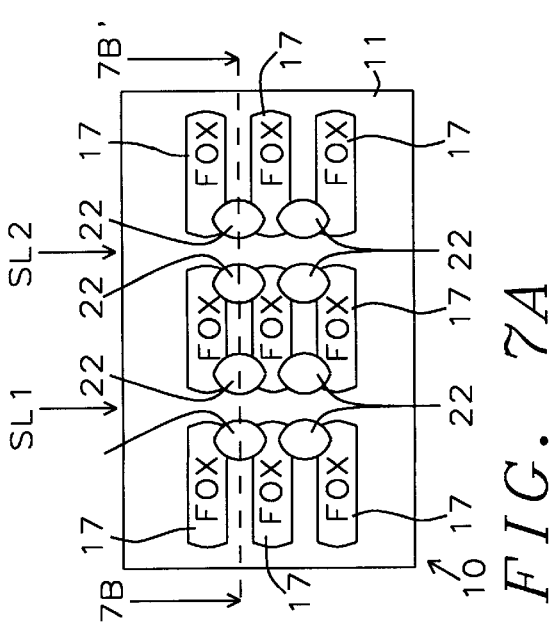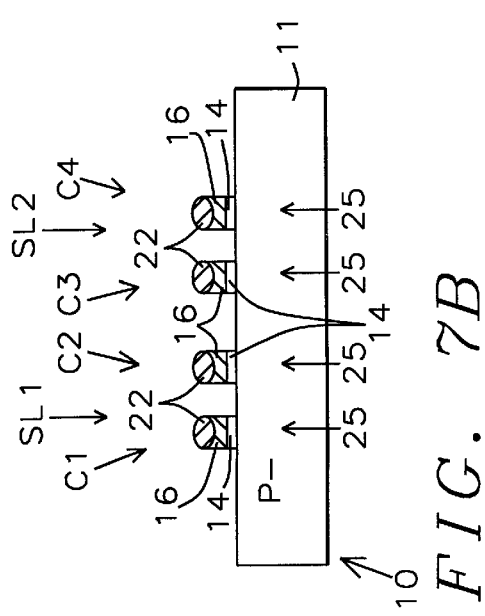

METHOD FOR SHRINKING ARRAY DIMENSIONS OF SPLIT GATE FLASH MEMORY DEVICE USING MULTILAYER ETCHING TO DEFINE CELL AND SOURCE LINE

BACKGROUND OF THE INVENTION

1. Field of the Invention

This invention relates to semiconductor devices and more particularly to MOSFET memory devices and methods of manufacture thereof.

2. Description of Related Art

U.S. Pat. No. 5,103,274 of Tang et al. for "Self-Aligned Source Process and Apparatus" and shows a method and apparatus for self-aligning a source region with a field oxide region and a polysilicon gate and word line in a semiconductor device.

U.S. Pat. No. 5,120,671 of Tang et al. for "Process for Self Aligning a Source Region with a Field Oxide Region and a Polysilicon Gate" teaches a method and apparatus for self-aligning a source region with a field oxide region and a polysilicon gate and word line in a semiconductor device. The method and apparatus allows reduced memory cell size and improved device density by substantially eliminating the bird's beak encroachment and corner rounding effects usually found between neighboring cells due to inadequacies in the prior art photolithography process.

U.S. Pat. No. 5,534,455 of Liu for "Method for Protecting a Stacked Gate Edge in a Semiconductor Device from Self Aligned Source (SAS) Etch" shows a process for protecting the stacked gate edge of a semiconductor device. The process provides the step of spacer formation before the Self-Aligned Source (SAS) etching is accomplished.

SUMMARY OF THE INVENTION

This invention provides a method for shrinking array dimensions by one mask defining of cell and source line in a split gate flash memory device.

1. The active region is defined with a silicon nitride mask.
2. Field oxidation is performed and the silicon nitride mask is removed.
3. The cell is defined (process is different from the traditional method since one block replaces two separate cells)
4. The polysilicon 2 (second polysilicon) layer is defined by forming a photoresist mask for the split gate mask pairs without the source lines, which are formed later.
5. Source lines are defined by one mask, the cell blocks are separated simultaneously by etching polysilicon 2 layer, polysilicon oxide, polysilicon 1 (first polysilicon) layer and field oxide regions away where unprotected by the photo resist mask.
6. Remove the photoresist and the basic cell has been completed.

A method in accordance with this invention comprises forming split gate electrode MOSFET devices by the following steps which also produces a structure in accordance with this invention.

Form a tunnel oxide layer over a semiconductor substrate. Form a floating gate electrode layer over the tunnel oxide layer. Form a masking cap over the floating gate electrode layer. Pattern a floating gate electrode stack formed by the tunnel oxide layer and the floating gate electrode layer in the pattern of the masking cap. Form intermetal dielectric and control gate layers over the substrate covering the stack and the source regions and the drain regions. Pattern the intermetal dielectric and control gate layers into adjacent mirror image split gate electrode pairs. Etch a source line slot bisecting the control gate layer and the floating gate stack. Form a source region through the source line slot with the gate electrode stack. Form a drain region self-aligned with the split gate electrodes and the gate electrode stack.

Preferably, form the floating gate electrode of a doped polysilicon layer. Form a silicon nitride floating gate mask over the polysilicon layer. Form the masking cap on the surface of the doped polysilicon by forming polysilicon oxide cap on the surface of the polysilicon layer. Pattern the tunnel oxide layer and the floating gate electrode layer in a subtractive process using the cap as a mask such as etching the tunnel oxide layer and the floating gate electrode layer using the cap as a mask to form the floating gate electrode.

Preferably, form FOX regions and then form active regions in the substrate prior to forming the tunnel oxide layer.

In accordance with another aspcect of this invention, form a tunnel oxide layer over a semiconductor substrate. Form a floating gate electrode layer over the tunnel oxide layer. Form a masking cap over the floating gate electrode layer. Pattern a gate electrode stack formed by the tunnel oxide layer and the floating gate electrode layer in the pattern of the masking cap. Form intermetal dielectric and control gate layers over the substrate covering the stack and the source regions and the drain regions. Pattern the intermetal dielectric and control gate layers into a combined split gate electrode. Pattern a source line slot in the center of the gate electrode stack down to the substrate. Form a source region self-aligned with the source line slot. Form a drain region self-aligned with the split gate electrodes and the gate electrode stack.

Preferably, form the floating gate electrode of a doped polysilicon layer. Pattern the tunnel oxide layer and the floating gate electrode layer in a subtractive process using the cap as a mask. Form the floating gate electrode of a doped polysilicon layer. Form a silicon nitride floating gate mask over the polysilicon layer. Form the masking cap on the surface of the doped polysilicon by forming polysilicon oxide cap on the surface of the polysilicon layer. Pattern the tunnel oxide layer and the floating gate electrode layer in a subtractive process using the cap as a mask.

Alternatively, start by forming the floating gate electrode of a doped polysilicon layer. Form a silicon nitride floating gate mask over the polysilicon layer. Form the masking cap on the surface of the doped polysilicon by forming polysilicon oxide cap on the surface of the polysilicon layer. Etch the tunnel oxide layer and the floating gate electrode layer using the cap as a mask to form the floating gate electrode. Form long FOX regions and then form active regions in the substrate prior to forming the tunnel oxide layer. Form a floating gate electrode from a doped polysilicon layer. Form a silicon nitride floating gate mask over the polysilicon layer. Form a masking cap on the surface of the doped polysilicon by forming polysilicon oxide cap on the surface of the polysilicon layer. The slot has a width from about 3500 Å to about 6500 Å.

BRIEF DESCRIPTION OF THE DRAWINGS

The foregoing and other aspects and advantages of this invention are explained and described below with reference to the accompanying drawings, in which:

FIG. 1 is also an enlarged view of a portion of the device of FIG. 8B.

FIG. 2 is also an enlarged view of a portion of the device of FIG. 16B.

FIGS. 4A and 4B show a plan view and a sectional view of the device of FIG. 1 in an early stage of manufacture. FIG. 4B is a section taken along line 4B–4B' in FIG. 4A.

FIGS. 5A and 5B show the device of FIGS. 4A and 4B after the field oxidation step formed FOX regions in the substrate through narrow windows in a FOX mask. FIG. 5A is a plan view of the device and FIG. 5B is a section taken along line 5B–5B' in FIG. 5A.

FIG. 6A is a plan view of the device. FIG. 6B is a section taken along line 6B–6B' in FIG. 6A.

FIGS. 7A and 7B show the device of FIGS. 6A and 6B after the floating gate mask was stripped from the surface of device revealing hard mask caps above the floating gate layers which has been patterned by etching. FIG. 6A is a plan view of the device. FIG. 7A is a plan view of the device. FIG. 7B is a section taken along line 7B–7B' in FIG. 7A which shows a set of floating gate stacks.

FIG. 8A is a plan view of the device. FIG. 8B is a section taken along line 8B–8B' in FIG. 8A.

FIGS. 9A and 9B show a plan view and a sectional view of the device of FIG. 2 in an early stage of manufacture. FIG. 9A is a plan view of the device. FIG. 9B is a section taken along line 9B–9B' in FIG. 9A.

FIGS. 10A and 10B show the device of FIGS. 9A and 9B after the field oxidation step formed FOX regions in the substrate through very wide windows in a FOX mask. FIG. 10A is a plan view of the device. FIG. 10B is a section taken along line 10B–10B' in FIG. 10A.

FIG. 11A is a plan view of the device. FIG. 11B is a section taken along line 11B–11B' in FIG. 11A.

FIGS. 12A and 12B show the device 30 of FIGS. 11A and 11B after the silicon nitride mask layer 41 was stripped from the surface of device 30. FIG. 12A is a plan view of the device. FIG. 12B is a section taken along line 12B–12B' in FIG. 12A showing that floating gate stacks have been formed.

FIG. 13A is a plan view of the device. FIG. 13B is a section taken along line 13B–13B' in FIG. 13A.

FIG. 14A is a plan view of the device. FIG. 14B is a section taken along line 14B–14B' in FIG. 14A.

In FIG. 15B the new cells stacks formed from cell blocks are shown in section. Since the devices are formed by the formation of slots through the FOX strips, where no encroachment was possible in the middle of the strips, the birds beak sections are substantially eliminated in those portions of the devices. FIG. 15B is a section taken along line 15B–15B' in FIG. 15A.

FIG. 16B is a section taken along line 16B–16B' in FIG. 16A.

DESCRIPTION OF THE PREFERRED EMBODIMENT

Figure 1:
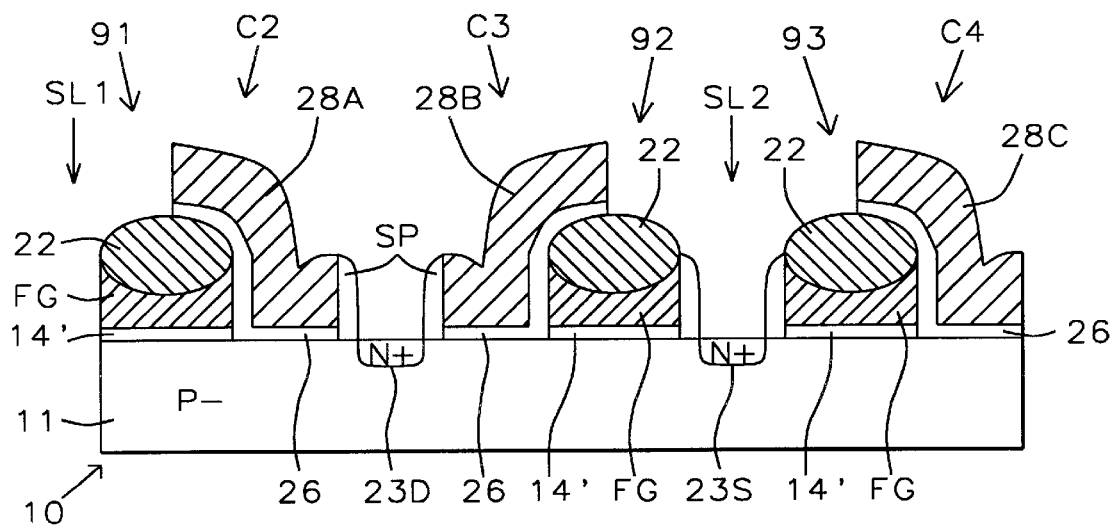
FIG. 1 shows a sectional elevation view of an enlarged view of a portion of a flash memory device in accordance with this invention with a pair of confronting, split gate, flash memory cells cells which are separated by a relatively wide slot.
Figure 8A:
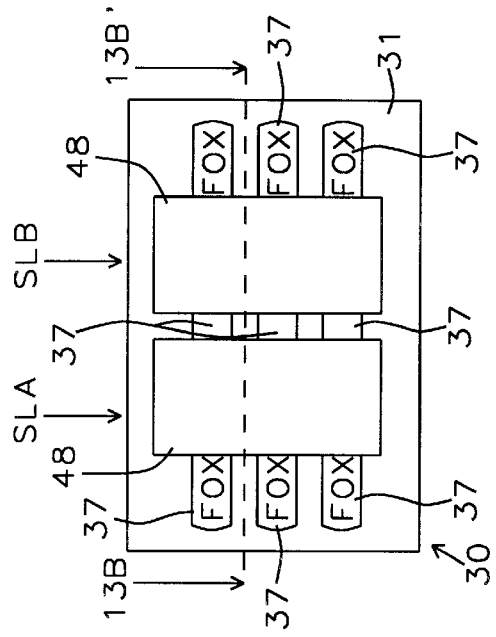
FIGS. 8A and 8B show the device of FIGS. 7A and 7B after the formation of self-aligned source/drain regions followed by addition of an InterMetal Dielectric (IMD) layer and a split gate control gate electrode of a flash memory EPROM device.
Figure 8B:
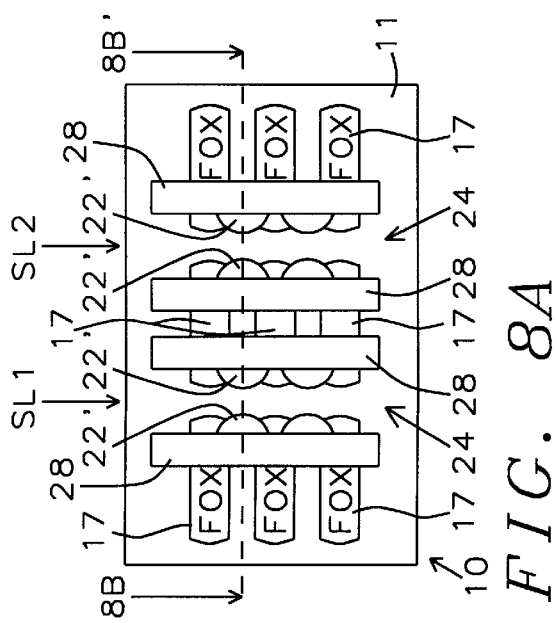

FIG. 1 shows a sectional elevation view of an enlarged view of a portion of a flash memory EPROM device 10 shown in FIGS. 8A and 8B device 10 with a pair of confronting, split gate, flash memory cells C2, C3 and C4 with cells C3 and C4 separated by a relatively wide slots SL1/SL2. Cells C2, C3 and C4 are formed on a P-doped silicon substrate 12. Above the substrate 11, a set of floating gate stacks 91, 92 and 93 are formed. Stacks 91, 92 and 93 are formed by polysilicon oxide caps 22 (which had served as hard masks 22 in forming the floating gate stacks 91, 92 and 93) overlie floating gate electrode stacks of tunnel oxide layer 14' and doped polysilicon floating gates FG which are patterned by etching into the pattern of caps 22 masks which had served as masks. The floating gate electrode stacks are juxtaposed with the narrow slots SL1/SL2 therebetween. Ion implanted, N+doped, source/drain regions 23S/23D are formed self-aligned with the floating gate electrode stacks of cells C1 and C2 and adjacent to those stacks. The drain region at the base of slots SL1/SL2 is shared between the juxtaposed stacks. In addition, InterMetal Dielectric (IMD) layer 26 and a set of mirror image split gate control gate electrodes 28 are formed on opposite sides of the pair of the floating gate electrode stacks on the outboard sides thereof, away from slots SL1/SL2. The IMD layer 26 is formed on the surface of the outboard sidewalls of the stacks of floating gates FG and and above an outboard portion of polyoxide caps 22 of cells C1 and C2. The control gate doped polysilicon electrodes are formed over the IMD layer 26 reaching over the outboard sides of stacks 90, 91, 92 and 93. The control gate polysilicon layer 28 and the IMD layer 26 have the same pattern which was produced by masking and a subtractive process such as selective chemical etching. Note that the control gate electrodes 28 are patterned to form mirror image split gate devices from the array of floating gate stacks. The set of four cells C1, C2, C3 and C4 have been completed by the addition of layers 26 and 28 as shown in FIG. 8B.

By mirror image, what is intended is to say that the split gate control gate electrodes 28 are on the outboard sides of the stacks 90, 91, 92 and 93 away from the slots SL1/SL2.

Figure 2:
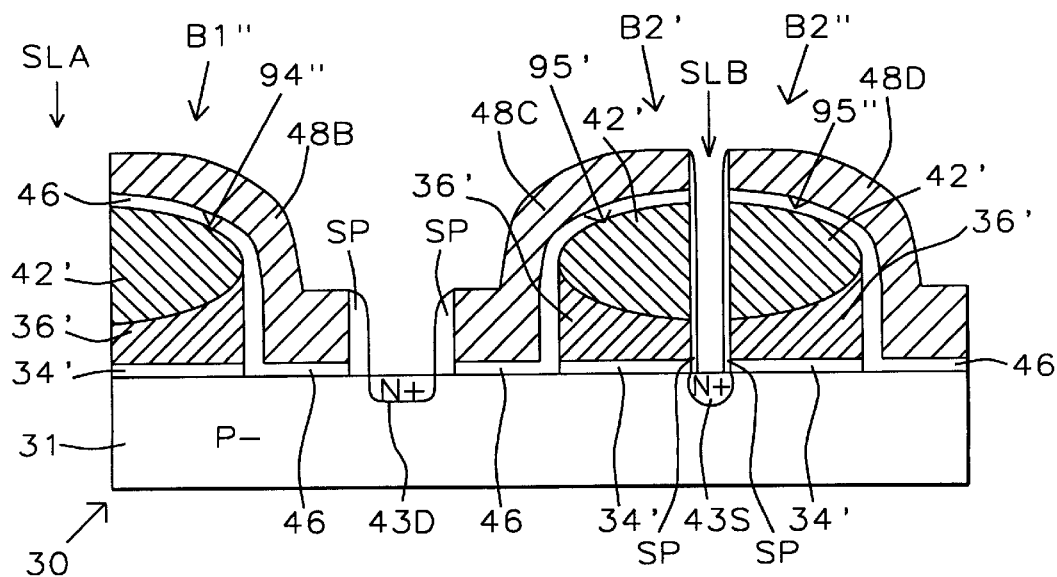
FIG. 2 shows an enlarged view of a portion of a device in accordance with this invention shown with a pair of confronting, split gate, flash memory cells cells which are separated by a very narrow slot.
Figure 13A:
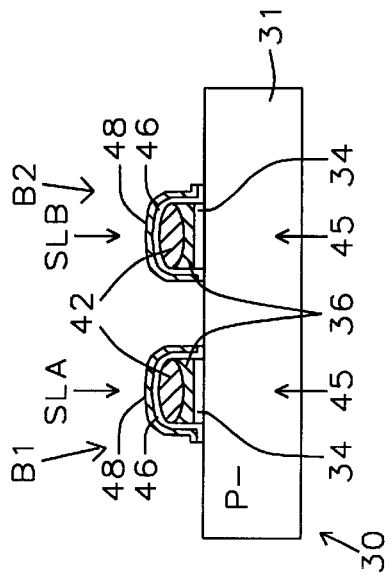
FIGS. 13A and 13B show the device of FIGS. 12A and 12B in which a source line mask is formed with source line slots therethrough provided in preparation for defining source lines.
Figure 13B:
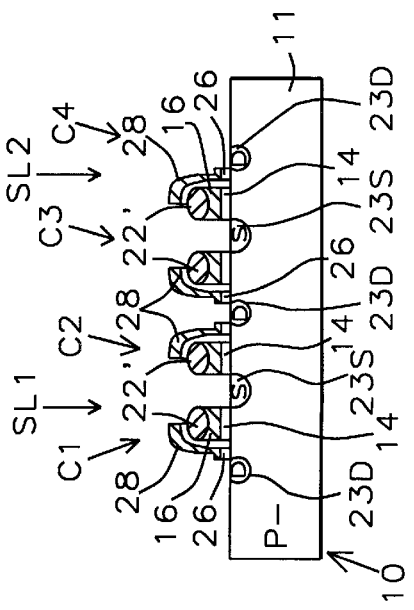
Figure 14B:
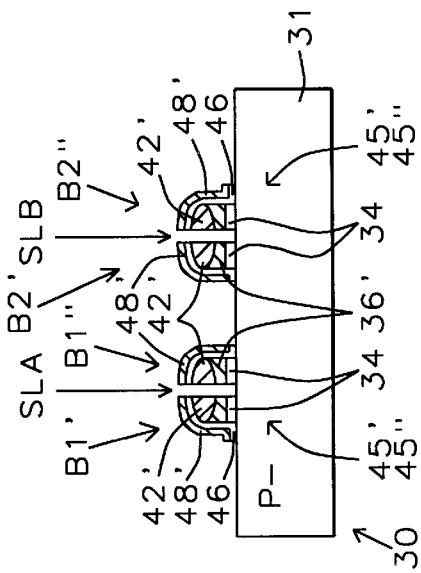
Figure 15A:
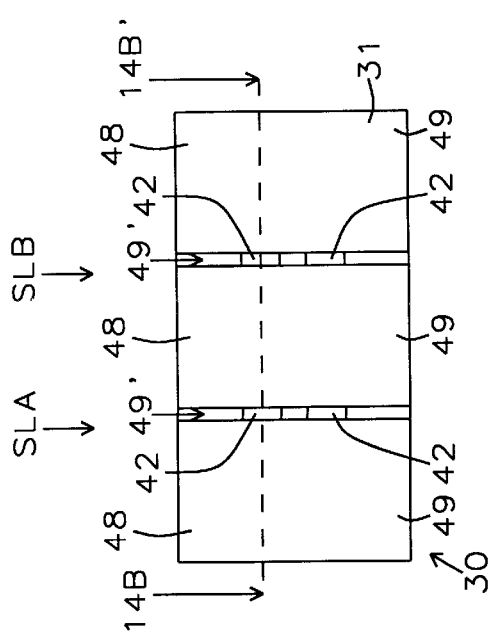
FIGS. 15A and 15B show the device of FIGS. 14A and 14B after the source line mask has been stripped from the device.
Figure 15B:
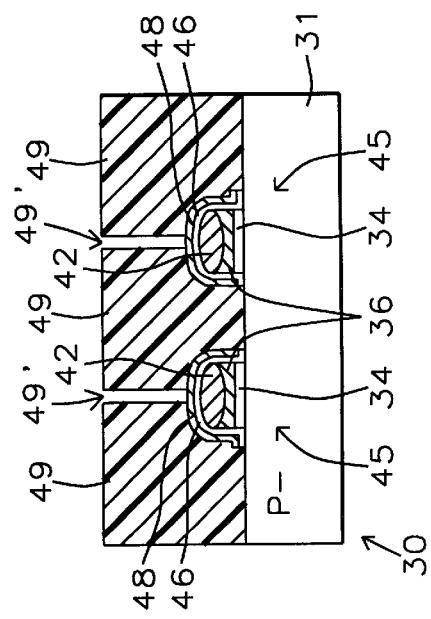

FIG. 2 show an enlarged view of a portion of a device 30 shown in FIG. 15B shows with a pair of confronting, split gate, flash memory cells cells B1' and B1', B2' and B2" which are separated by a very narrow slots SLA/SLB having a width from about 3500 Å to about 6500 Å. Cells B1' and B1" are formed on a P-doped silicon substrate 31. Above the substrate 31, a pair of floating gate stacks 45, are formed from what was a former stack 45 (as seen below in FIGS. 14B and 15B). Each stack 45 has been split by one of the slots SLA/SLB etched to form separate stacks 94, 95, and The tops of stacks 45 and are formed by polysilicon oxide caps 42' which had served as parts of a hard mask 42 (shown in FIG. 12B) in forming the floating gate stacks 45 and 45. Caps 42' overlie stacks 45/45, and comprising tunnel oxide layer 34' and doped polysilicon floating gates 36' which were patterned by etching using the cap 42 as a mask as seen in FIG. 12B. The floating gate electrode stacks 45, 45 and are juxtaposed with the very narrow slots SLA/SLB therebetween. Ion implanted, N+doped, drain regions 43S/43D are formed self-aligned with the control gate electrodes of cells B1', B1", B2', and B2" adjacent to those stacks. The source regions 43S at the base of a very narrow slots SLA/SLB is shared between the juxtaposed stacks 45, 45, and. In addition, InterMetal Dielectric (IMD) layer 46 and a set of mirror image split gate control gate electrodes 48A, 48B, 48C and 48D are formed on opposite sides above the pair of the floating gate electrode stacks 94, 95, 96 and 97 and on the outboard sides thereof. The IMD layer 46 and control gate electrodes 48A, 48B, 48C and 48D are also split by the very narrow slots SLA/SLB. The IMD layer 46 is formed over the surfaces of substrate 11 and the stacks 45, 45, and including the outboard sidewalls of floating gates 36' and above the polyoxide caps 42' of cells B1', B1", B2' and B2". The control gate doped polysilicon electrodes, 48B, 48C and 48D seen in FIG. 2 are formed over the IMD layer 46 reaching over the stacks 45, 45 and 97. The control gate polysilicon electrodes, 48B, 48C and 48D seen in FIG. 2 and the IMD layer 46 have the same pattern which was produced by masking and a subtractive process such as selective chemical etching to form slots SLA/SLB. Note that the control gate electrodes, 48B, 48C and 48D are patterned to form split gate devices from an array of floating gate stacks. The set of two cells B1, B1", B2' and B2" seen in FIGS. 15B and 15C have been completed by the addition of layers 46 and 48 as shown in FIG. 13B.

By mirror image, what is intended is to say that the split gate control gate electrodes, 48B, 48C and 48D are formed on the tops and outside surfaces of the stacks, 45, 45 and away from the slots SLA/SLB.

FIRST PROCESS

FIGS. 4A and 4B show a plan view and a sectional view of the device 10 of FIG. 1 in an early stage of manufacture. FIG. 4A is a plan view of device 10 and FIG. 4B is a section taken along line 4B-4B' in FIG. 4A. Device 10 is formed of a P-doped silicon substrate 11 covered with a pad oxide layer 12 covered with an active region silicon nitride mask 13 with Field OXide (FOX) windows 13' through mask 13 for definition of the FOX regions 17 (seen in FIGS. 5A and 5B) and the active regions in substrate 11, aside from the FOX regions 17 through windows 13' in the silicon nitride mask 13. The pad oxide layer 12 has been etched through mask 13 to form windows 12' exposing the surface of substrate 11 through openings 13' in mask 13.

In FIGS. 4A, the vertically extending silicon nitride channels between windows 13' will define source lines SL1, SL2, SL3 and SL4 formed under the mask 13 for a set of parallel common source regions.

FIGS. 5A and 5B show the device 10 of FIGS. 4A and 4B after the field oxidation step formed FOX regions 17 in substrate 11 through the windows 13' in silicon nitride FOX mask 13. FIG. 5A is a plan view of device 10 and FIG. 5B is a section taken along line 5B-5B' in FIG. 5A. There is bird's beak encroachment about FOX regions 17 in the middle where source lines SL2 and SL3 are formed, where the memory cells are to be formed in subsequent steps.

Figure 6A:
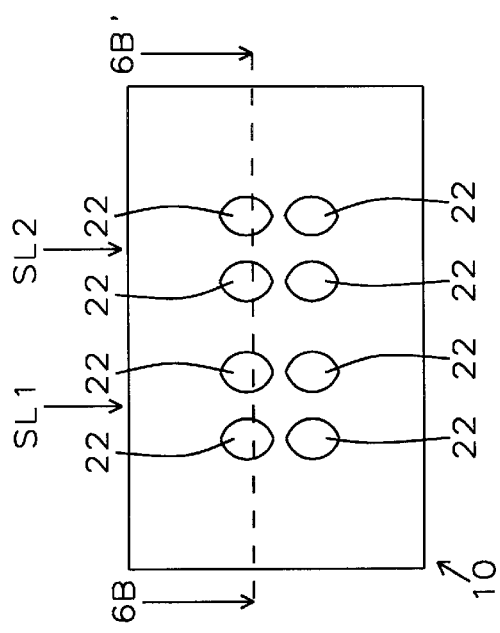
FIGS. 6A and 6B show the device of FIGS. 5A and 5B after the mask and pad oxide layer have been stripped from the substrate, floating gate layers have been formed on the substrate and a polyoxide cap (hard mask) has been formed on the top of the floating gate layers.
Figure 6B:
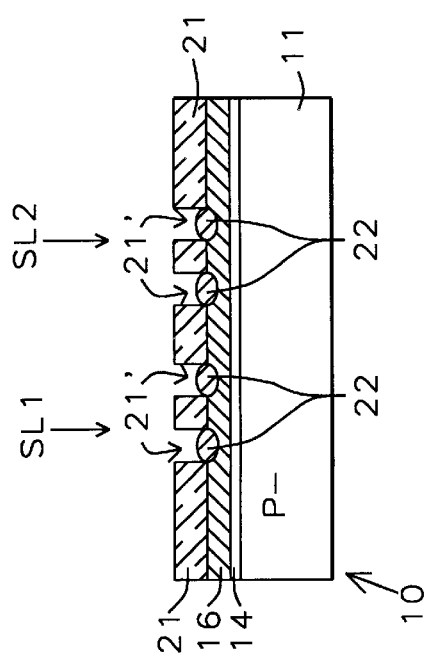

FIGS. 6A and 6B show the device 10 of FIGS. 5A and 5B after the silicon nitride mask 13 and pad oxide layer 12 have been stripped from the surface of substrate 11 in the steps which precede cell definition. FIG. 6A is a plan view of device 10. FIG. 6B is a section taken along line 6B-6B' in FIG. 6A. Then a blanket tunnel oxide layer 14 has been formed over the exposed surfaces of substrate 11. Next, in a blanket deposition process a floating gate, first doped polysilicon layer FG was formed blanketing the surfaces of both the tunnel oxide layer 14 and the FOX regions 17. Next, a blanket silicon nitride mask layer 21 was formed over first doped polysilicon layer 16. Mask layer 21 was patterned by a photoresist mask (not shown) used to etch silicon nitride mask 21 to form floating gate windows 21' therethrough down to the surface of polysilicon layer 16 in places indicated in FIG. 6B. Then, the photoresist mask was stripped away leaving the mask layer 21 with floating gate windows 21' therethrough as seen in FIGS. 6A and 6B.

Then the portions of the surface of the first doped polysilicon layer 16 which are exposed through the floating gate windows 21' in the silicon nitride mask layer 21 are oxidized in a conventional process to form polysilicon oxide (polysilicon oxide) caps 22 over the surface of the polysilicon layer 16. Caps 22 provide a hard mask used as described next.

FIGS. 7A and 7B show the device 10 of FIGS. 6A and 6B after the silicon nitride mask layer 21 was stripped from the surface of device 10 revealing the polysilicon oxide caps 22 (hard mask) above the remainder of the polysilicon 1 layer 16. Note that the remainder of polysilicon layer 16 was etched away to form an array of floating gate electrode stacks ST including floating gate electrodes FG which have been patterned by etching using the polysilicon oxide caps 22 as a mask. FIG. 7A is a plan view of device 10. FIG. 7B is a section taken along line 7B-7B' in FIG. 7A which shows a set of floating gate stacks which have been formed by the etching step for four cells C1, C2, C3 and C4 which are to be formed. The polysilicon 1 layer 16 and tunnel oxide layer 14 were etched in a selective etching process as referred to in step 54 which etches away the exposed polysilicon 16 while leaving the floating gate stacks ST composed of polysilicon oxide caps 22 and the portions of polysilicon layer FG and tunnel oxide layer 14 therebelow intact.

FIGS. 8A and 8B show the device 10 of FIGS. 7A and 7B after the formation of self-aligned source/drain regions 23D and 23S followed by InterMetal Dielectric (IMD) layers 26 and control gate electrodes 28. FIG. 8A is a plan view of device 10. FIG. 8B is a section taken along line 8B-8B' in FIG. 8A. In addition, InterMetal Dielectric (IMD) layer 26 has been formed over the entire device 10, followed by a blanket deposition of the second, control gate polysilicon layer 28. Then a mask (not shown) was employed to pattern the control gate polysilicon layer 28 and the IMD layer 26 by a subtractive process such as selective chemical etching.

Note that the control gate electrodes 28 are patterned to form split gate devices from the array of floating gate stacks. The set of four cells C1, C2, C3 and C4 have been completed by the addition of IMD and control gate layers 26 and 28.

In summary, the method of FIGS. 4A–8B involves the following basic steps:

1. Define the active regions with the silicon nitride mask 13 with source lines SL1, SL2, SL3 and SL4 formed under the locations of mask 13 seen in FIG. 5B.
2. Form the final active region after field oxidation, with encroachment of about 0.1 μm/per side of the field oxide regions 17, and removal of silicon nitride mask 13.
3. Definition of the cells.
4. Definition of the polysilicon 2 layer 28 and formation of the cell.

Characteristics of the design are as follows:

1. The shape of active region in memory cell is arranged such as isolated islands in split gate flash.
2. The encroachment of field oxidation in source line have to be considered, so the active area (OD) design rule can not be easily scaled down.
3. The cells which are arranged on the two sides of the source lines in a separated arrangement, so the cell dimensions are not easy to scale down for encroachment effect after polysilicon oxidation.

SECOND PROCESS

FIGS. 9A and 9B show a plan view and a sectional view of the device 30 of FIG. 2 in an early stage of manufacture. FIG. 9A is a plan view of device 30. FIG. 9B is a section taken along line 9B–9B' in FIG. 9A. Device 30 is formed of a P–doped silicon substrate 31 covered with a pad oxide layer 32, as referred to in step 60 in FIG. 3A. Layer 32 is covered with an active region silicon nitride mask 33 with wide Field OXide (FOX) windows 33' through mask 33 for definition of the very wide FOX regions 37 (seen in FIGS. 10A and 10B) and the active regions in substrate 31, aside from the FOX regions 37 through windows 33' in the silicon nitride mask 33, as referred to in step 61 in FIG. 3A. The pad oxide layer 32 has been etched in a conventional manner through windows 33' in the silicon nitride mask 33 to form windows 32' in pad oxide layer 32, (as referred to in step 62 in FIG. 3A) exposing the surface of substrate 31 through openings 33' in mask 33. In FIGS. 9A, there is no set of vertically extending silicon nitride channels between windows 33' to define source lines for a common source region, as described in connection with FIGS. 4A–8A and 4B–8B. The advantage is that there is no encroachment in the middle of the stripes where the devices are to be formed in subsequent steps.

Figure 3A:
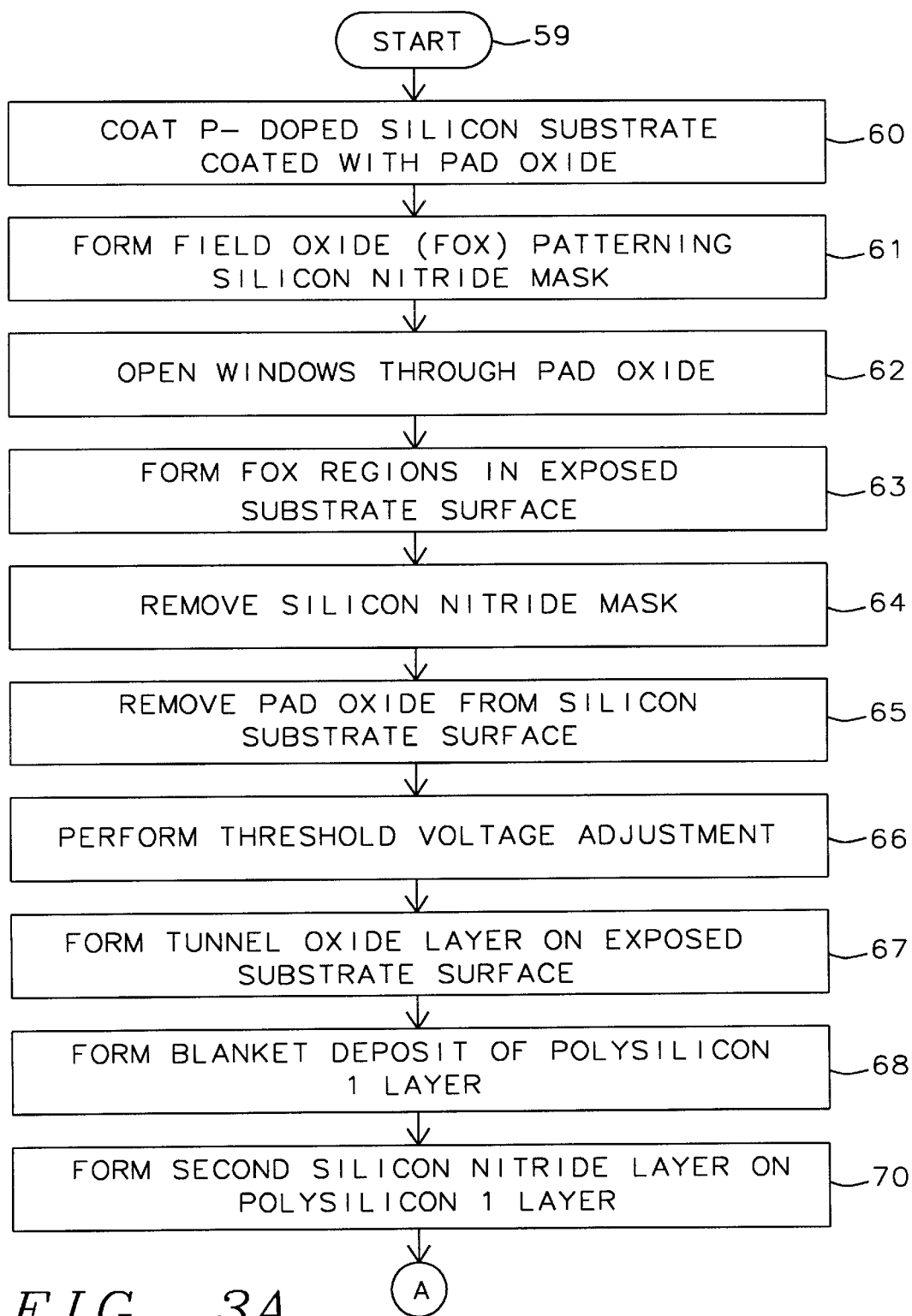
FIGS. 3A–3C show a flow chart of the embodiment of the method of this invention shown in FIGS. 2, FIGS. 9A–16A and FIGS. 9B–16B which makes it possible to achieve the narrow slot device of FIG. 2.

FIGS. 10A and 10B show the device 30 of FIGS. 9A and 9B after the field oxidation step formed long stripes of FOX regions 37 in substrate 31 through the windows 33' in silicon nitride FOX mask 33 and the windows 32' in the pad oxide layer 32, as referred to in step 63 in FIG. 3A. FIG. 10A is a plan view of device 30. FIG. 10B is a section taken along line 10B–10B' in FIG. 10A.

Note that the long stripes of FOX regions 37 are quite different in configuration from the short FOX regions 17 in FIGS. 5A and 5B because there are no vertically extending silicon nitride channels breaking up windows 33'. Thus there is the advantage that there is no bird's beak encroachment in the middle of FOX regions 37 where source lines SLA and SLB will be formed as shown in FIGS. 13A and 13B, when the memory cells are formed in subsequent steps.

Figure 11A:
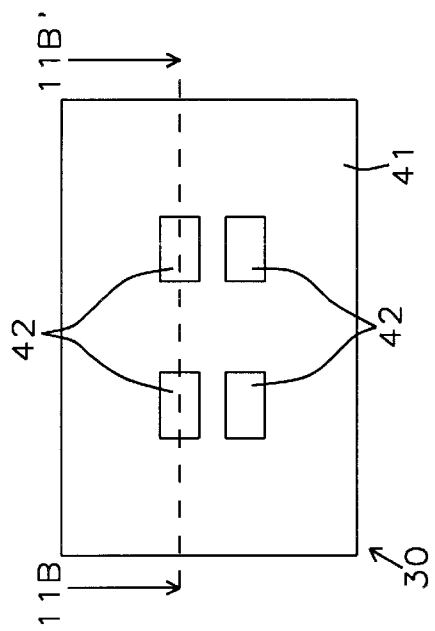
FIGS. 11A and 11B show the device 30 of FIGS. 10A and 10B after the FOX mask and pad oxide layer have been stripped from the substrate, floating gate layers have been formed on the substrate and a polyoxide cap (hard mask) has been formed on the top of the floating gate layers.
Figure 11B:
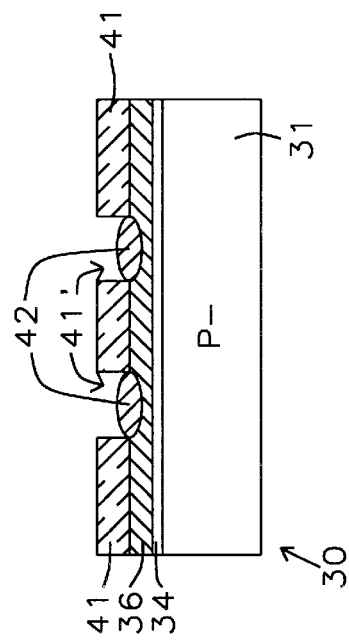

FIGS. 11A and 11B show the device 30 of FIGS. 10A and 10B after several intermediate steps. FIG. 11A is a plan view of device 30. FIG. 11B is a section taken along line 11B–11B' in FIG. 11A. First, the silicon nitride FOX mask 33 and pad oxide layer 32 have been stripped from the surface of substrate 31, as referred to in step 64 in FIG. 3A, before cell definition. Then a threshold implant is performed in step 66 in FIG. 3A.

Next, a blanket tunnel oxide layer 34 was formed over the exposed surfaces of substrate 31 aside from the FOX regions 37 in a blanket deposition process referred to in step 67 in FIG. 3A.

Next, in a blanket deposition process referred to in step 68 in FIG. 3A, a floating gate, first doped polysilicon layer 36 was formed blanketing the surfaces of both the tunnel oxide layer 34 and the FOX regions 37 (not shown in FIGS. 11A and 11B).

Next, in step 70 in FIG. 3A, a blanket silicon nitride mask layer 41 was formed over first doped polysilicon layer 36 layer.

Next layer 41 was patterned into a second silicon nitride mask layer 41 which has floating gate windows 41' therethrough. Floating gate windows 41' were patterned by a photoresist mask (not shown but referred to in step 71 in FIG. 3B), and etching of second silicon nitride mask 41 to form floating gate windows 41' therethrough (referred to in step 72 in FIG. 3B).

Then, the photoresist mask was stripped away leaving the silicon nitride mask layer 41 with floating gate windows 41' therethrough (referred to in step 73 in FIG. 3B), as seen in FIGS. 11A and 11B.

Figure 3B:
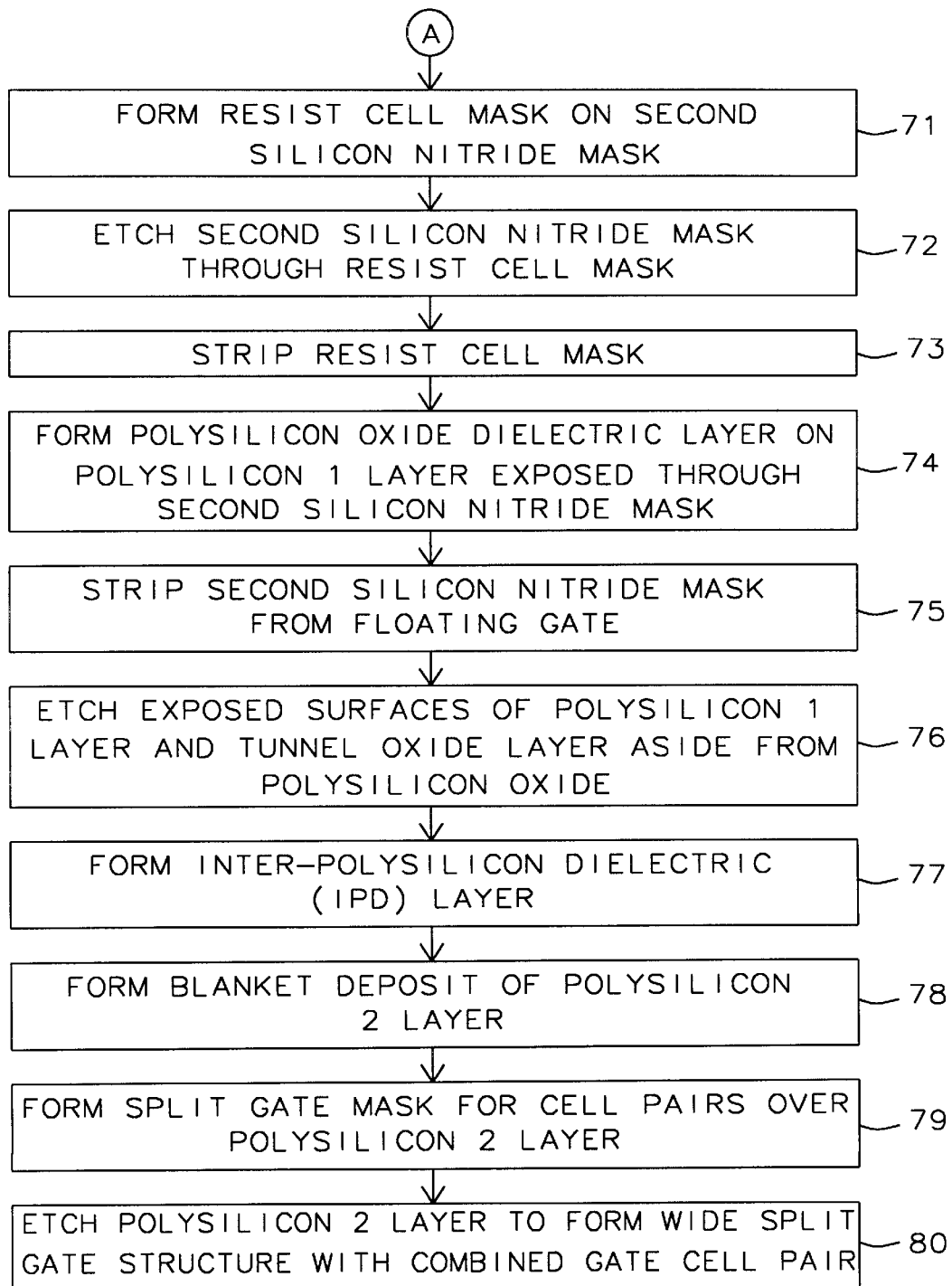

Finally, the portions of the surface of the first doped polysilicon 1 layer 36 which are exposed through the floating gate windows 41' in the silicon nitride mask layer 41 were oxidized in a conventional process to form polysilicon oxide (polysilicon oxide) caps 42 over the surface of the polysilicon 1 layer 36 at the bottom of the floating gate windows 41' (referred to in step 74 in FIG. 3B). Polysilicon oxide caps 42 were formed to provide caps 42 as a hard mask to be used for patterning a set of cell blocks B1 and B2 of memory device 30 in the steps illustrated by FIGS. 12A and 12B. FIG. 2 shows one such block B1 after completion of a process in accordance with this invention.

FIGS. 12A and 12B show the device 30 of FIGS. 11A and 11B after the second silicon nitride mask layer 41 was stripped from the surface of device 30 (referred to in step 75 in FIG. 3B). FIG. 12A is a plan view of device 30. FIG. 12B is a section taken along line 12B–12B' in FIG. 12A showing that a pair of floating gate stacks ST have been formed.

The plan view of FIG. 12A reveals the location of four hard mask caps 42 (polysilicon oxide regions) above the remainder of the polysilicon 1 layer 36. Note that the exposed portions of polysilicon layer 36 were etched away to form an array of floating gate stacks including floating gate electrodes 36 which have been patterned by etching using the polysilicon oxide caps 42 as a mask. The polysilicon 1 layer 36 and tunnel oxide layer 34 were etched in a selective etching process (referred to in step 76 in FIG. 3B) which etches away the exposed polysilicon 36 while leaving the floating gate stacks ST composed of polysilicon oxide caps 42 and the portions of polysilicon 1 layer 36 and tunnel oxide layer 34 therebelow intact, as referred to in step 76 in FIG. 3B. Note that comparing FIG. 7B to FIG. 12B, in FIG. 12B there is only one of the cell blocks B1 or B2 of a memory device replacing two separate cells, where cell B1 replaces cells and C1 and C2 and cell B2 replaces cells C3 and C4 of the kind seen in FIG. 7B.

FIG. 13A is a plan view of device 30 and FIG. 13B is a section taken along line 13B–13B' in FIG. 13A. FIGS. 13A and 13B show the device 30 of FIGS. 12A and 12B after steps 77, 78, 79, and 80 in FIG. 3B and steps 84 and 88 in FIG. 3C starting with formation of InterMetal Dielectric (IMD) layer 46 over the entire device 30, as referred to in step 77 in FIG. 3B, followed by a blanket deposition of the second, control gate polysilicon layer 48, as referred to in step 78 in FIG. 3B, formation of a photoresist split gate mask for cell pairs (not shown) is formed over the polysilicon 2 layer 48 as as referred to in step 79 in FIG. 3B; and with the split gate mask in place, an etching steps follows in which the polysilicon 2 layer 48 and the IMD layer 46 are etched to form the combined control gates 48 of cell pairs B1 and B2 as seen in FIG. 13B, as referred to in step 80 in FIG. 3C; and finally, the split gate mask is stripped from the device 30 leaving the structure seen in FIG. 13B, as referred to in step 81 in FIG. 3C.

Figure 3C:
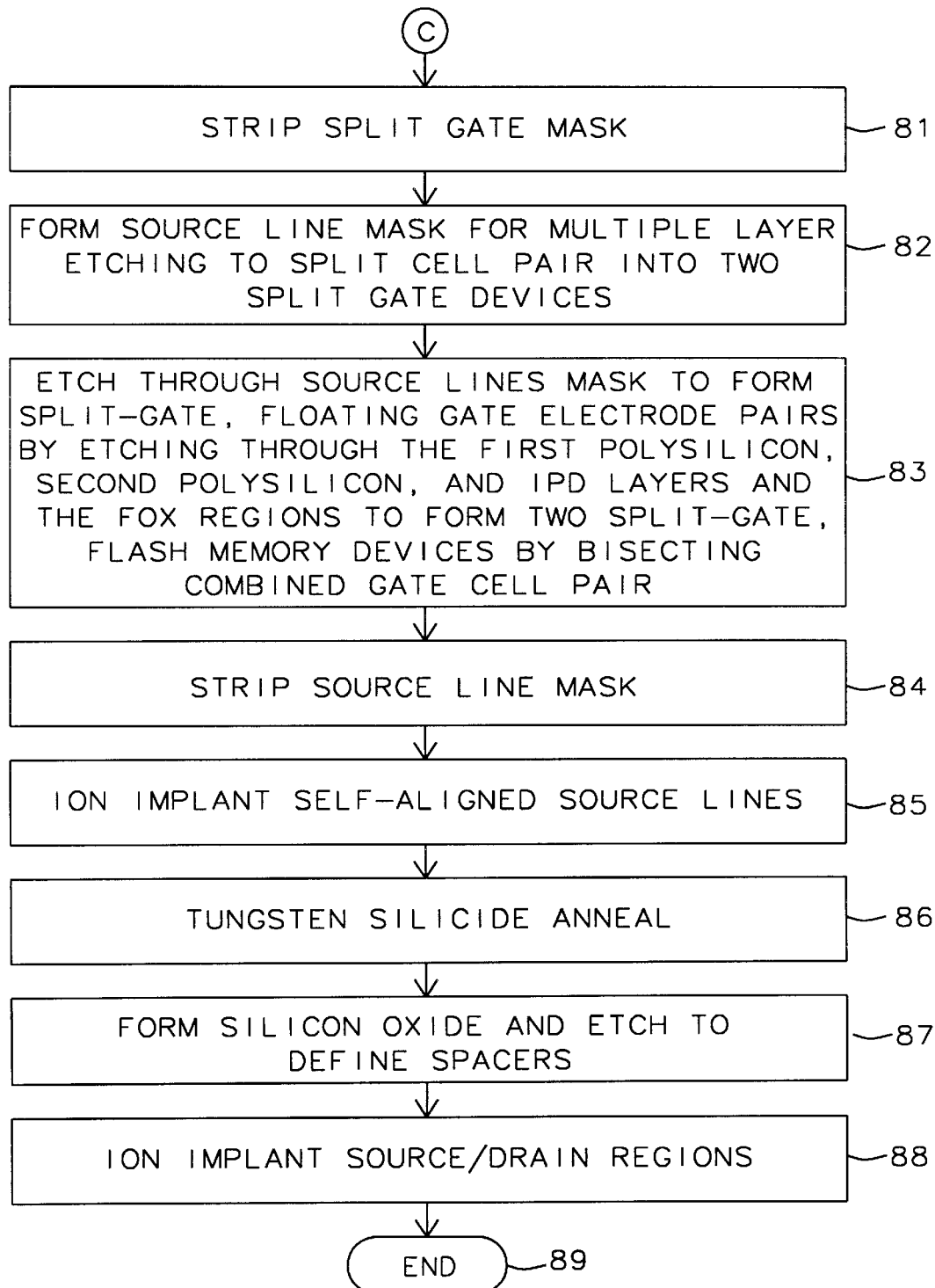
Figure 14A:
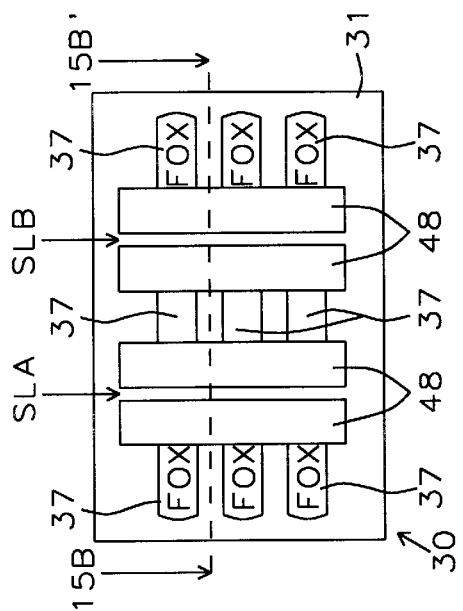
FIGS. 14A and 14B show the device of FIGS. 13A and 13B after the IMD caps, floating gate polysilicon layer and tunnel oxide layer and field oxide regions below the source line slots have been etched away to form a slot seen in FIGS. 15A and 15B between separate cells forming a pair of cells from each of the cell blocks.

FIGS. 14A and 14B show the device 30 of FIGS. 13A and 13B after formation of a source line/multi-layer etching mask 49 to prepare for separating the combined control gates 48 into separate control gates, 48B, 48C and 48D (as seen in FIG. 2) at the same time that the source lines are being formed, as referred to in step 82 in FIG. 3C. FIG. 14A is a plan view of device 30 and FIG. 14B is a section taken along line 14B–14B' in FIG. 14A showing the device 30 with a mask 49 formed over the combined gate cell pairs B1 and B2 of FIG. 13B. Mask 49 includes slots 49' reaching down to the centers of the surfaces of the combined control gates 48.

FIGS. 15A and 15B show the device 30 of FIGS. 14A and 14B after etching through mask 49 as described in step 92 in FIG. 3C. FIG. 15B is a section taken along line 15B–15B' in FIG. 15A showing how patterning with the slots 49' has formed separate devices B1', B1" and B2', B2". The mask 49 has been employed to pattern the control gate polysilicon layer 48 and the IMD layer 46 by a subtractive process such as selective chemical etching. At the same time, the control gate electrodes 48 and floating gate stacks ST are patterned to form split gate devices from the combined gate cell pairs B1 and B2, as referred to in step 83 in FIG. 3C.

Photoresist mask 49 was formed with source line slots 49' therethrough provided in preparation for defining source lines SLA and SLB. During the process step 92 the cell blocks B1 and B2 are separated simultaneously by introducing etching materials through the slots 49' into contact with the layers below including control gate electrode polysilicon layer 48, IMD layer 46, polysilicon oxide layer caps 42, floating gate polysilicon 1 layer 36, tunnel oxide layer 34 and field oxide regions below slots 43' have been etched away to form a pair of slots SLA/SLB seen in FIGS. 15A and 15B between separate cells splitting each of the B1 and B2 in two, forming a pair of cells B1', B1" and B2', B2" from those blocks B1 and B2. The result of forming the slots SLA/SLB in the blocks B1 and B2 is the formation of a set of floating gate stacks 45, and 45 of tunnel oxide layers 34' and floating gate electrodes 36'.

In FIG. 15B four new cells stacks B1', B1", B2', and B2' formed from blocks B1 and B2 are shown in section. Since the devices are formed by the formation of slots SLA/SLB through the FOX strips 37, where no encroachment was possible in the middle of the strips, the birds beak sections are substantially eliminated in those portions of the devices.

Then the source line mask is stripped from the device in step 84, source regions 43S are ion implanted through the source lines SLA and SLB in step 85; and tungsten silicide is annealed in step 86.

Figure 16A:
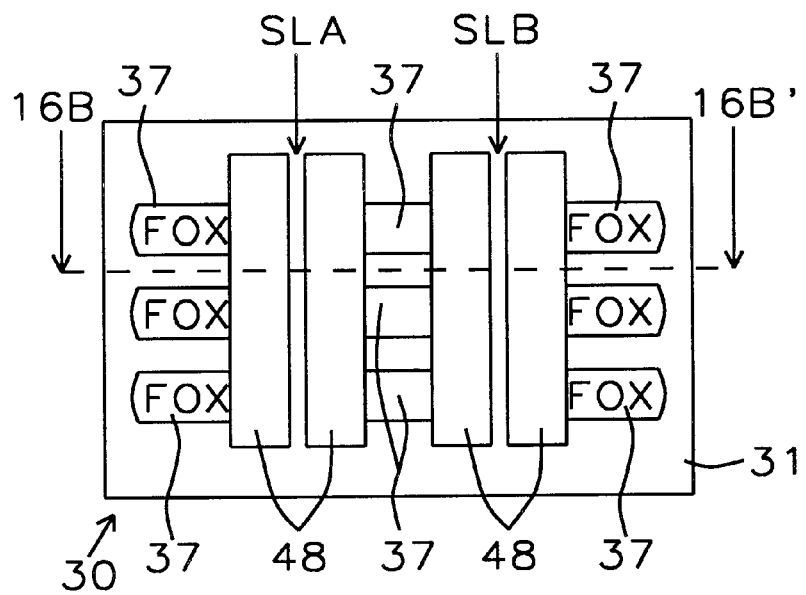
FIGS. 16A and 16B show the device of FIGS. 15A and 15B after the formation of self-aligned source/drain regions. In addition, InterMetal Dielectric (IMD) layer has been formed over the entire device followed by a blanket deposition of the second, control gate polysilicon layer. The control gate electrodes are patterned to form split gate devices from the array of floating gate stacks.
Figure 16B:
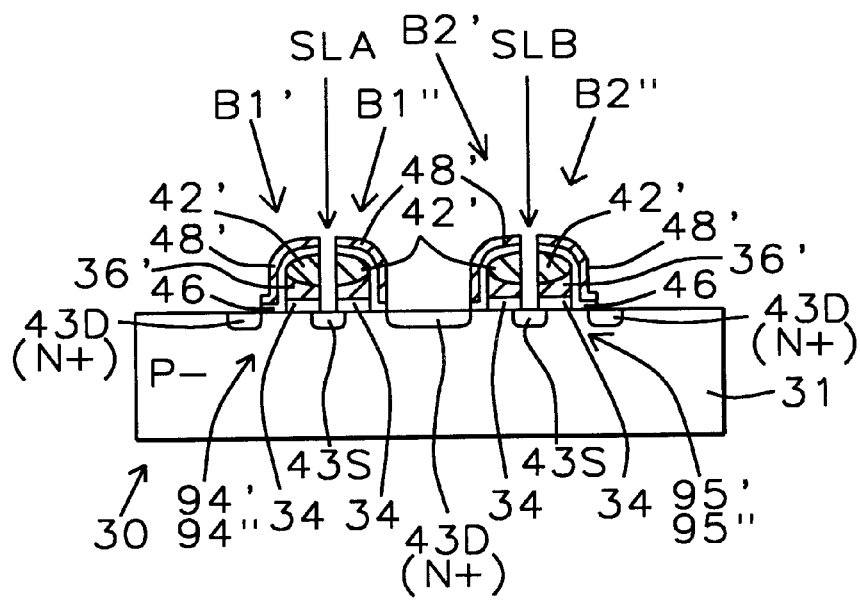

FIGS. 16A and 16B show the device 30 of FIGS. 15A and 15B after the formation of spacers SP (seen in FIG. 2), as described in step 87 in FIG. 3C; followed by formation of self-aligned source regions 43S through the slots SLA/SLB by a conventional ion implantation process, as described in step 88 in FIG. 3C.

FIGS. 3A–3C show a flow chart of the embodiment of the method of this invention shown in FIGS. 2, FIGS. 9A–16A and FIGS. 9B–16B. The process described by the flow chart of FIGS. 3A–3C makes it possible to achieve the narrow slot device of FIG. 2. The process begins at start 59.

The next step is to form a mask (33, as seen in FIG. 9B, comprising a field oxide (FOX) patterning silicon nitride mask with wide FOX windows 33' over pad oxide layer 32, which is coated upon P-doped silicon substrate 31 and as described in step 61.

Then in step 62, open windows 32' through pad oxide layer 32 as seen in FIG. 9B; and in step 63 form FOX regions 37, as seen in FIG. 10B, in the exposed surface of substrate 31.

In step 64, removes silicon nitride mask 33 from device 30, as seen in FIG. 11B.

In step 65, remove the pad oxide layer 32 from the surface of silicon substrate 31, as seen in FIG. 11B.

Step 66 involves performance of threshold voltage adjustment, by ion implanting into the active area and as by doping the exposed substrate 31 aside from the FOX regions 37 by ion implanting with a conventional dose of dopant.

Next in step 67 form a conventional blanket tunnel oxide layer 34, as seen in FIG. 11B on exposed surface of substrate 31 aside from the FOX regions 37.

Perform a blanket deposition of a polysilicon floating gate layer 36, as seen in FIG. 11B and as described in step 68.

Form a second, cell defining, silicon nitride mask 41 over floating gate polysilicon 1 layer 36 as seen in FIG. 11B, as described in step 70.

Form a photoresist cell mask (not shown) over second silicon nitride mask, as described in step 71.

FIG. 3B shows the next portion of the flow chart continuing to step 72 which calls for etching (or otherwise pattern) second silicon nitride mask 41 through cell mask as seen in FIG. 11B.

Then strip photoresist cell mask and as described in step 73, as shown in FIG. 11B.

As described in step 74, form polysilicon oxide dielectric blocks B1 and B2 in the form of caps 42 over exposed surfaces of polysilicon 1 floating gate layer 36 as seen in FIG. 11B.

Strip second silicon nitride mask 41 from floating gate as seen in FIG. 12B and as described in step 75.

In step 76, etch exposed surfaces of polysilicon 1 layer and tunnel oxide layer 34 aside from polysilicon oxide to form floating gate stacks ST. Exposed portions of polysilicon 36 and tunnel oxide layer 34 unprotected by polysilicon oxide caps 42 have been removed, as seen in FIG. 12B.

Referring to step 77, form InterMetal Dielectric (IMD) layer 46, as seen in FIGS. 16A/16B.

Then perform a blanket deposition of a doped, polysilicon 2 layer 48, as seen in FIGS. 16A/16B, as described in step 78.

Next, form a split gate mask (not shown), as described in step 79 as in FIG. 3B.

Then, etch to form blocks B1 and B2 pairs from polysilicon 2 layer 48 and IMD layer 46 to form control gate electrodes 48, as well as completing the split gate devices, as seen in FIGS. 13A/13B, as described in step 80 in FIG. 3C.

In step 81, strip the split gate mask.

In step 82, form a source line mask 49 with slots therethrough for defining source line slots SLA/SLB with mask 49 with slots 49' therethrough as seen in FIGS. 14/14B.

Then in step 83, etch through polysilicon oxide layer 42, polysilicon 1 layer 36 and FOX to form floating gates and source line slots SLA and SLB, as described in step 92, as seen in FIGS. 15A/15B.

In step 84, strip the source line mask 49.

In step 85, form source regions 43S as seen in FIG. 16B by ion implanting with a dose of N type dopant.

In step 86, anneal the tungsten silicide of the gate structure.

In step 87, form silicon oxide spacer layer and etch back to form the spacers SP seen in FIG. 2.

Referring to step 88, form self-aligned drain regions 43D by ion implantation into substrate 31 forming drain regions 43D, as seen in FIG. 13B. The drain regions 43D are formed by ion implanting with a dose of N type dopant.

SUMMARY

1. The shape of field oxide begins with rows of long stripes.
2. Cells are defined like blocks between field oxide, then polysilicon-silicon nitride are etch away and polysilicon oxidation are done such as conventional method of split gate flash processing.
3. After silicon nitride removal and polysilicon etching, floating gates are formed basically. Next, the polysilicon 2 layer is defined like columns perpendicular to field oxide stripes, and floating gate is covered by polysilicon 2 layer.
4. A pattern of source lines perpendicular to field oxide stripes is defined, which separate the blocks of floating gate. and polysilicon 2 layer. By the multi-layer etching of the polysilicon 2 layer, the polysilicon oxide, the polysilicon 1 layer and the field oxide, the cells with self-aligned source regions are formed, which makes it easy to scale down the cell dimension for decreasing the encroachment effect of field oxide and polysilicon oxide.

The present invention solved the problems found in other designs as follows:

1. Improvement of the photo process window in active region define for the issue of pull back in head of field oxide.
2. Solves the encroachment issue in field oxide, which make it easy to shrink the active area (OD) design rule.
3. Reduces the encroachment issue in floating gate after polysilicon oxidation.

The process steps are as follows:

1. The active region is defined with a silicon nitride mask.
2. Field oxidation is performed and the silicon nitride mask is removed.
3. The cell is defined (process is different from the traditional method since one block replaces two separate cells)
4. The polysilicon 2 layer is defined by forming a photoresist mask for the split gate mask pairs without the source lines, which are formed later.
5. Source lines are defined by one mask, the cell blocks are separated simultaneously by etching polysilicon 2 layer, polysilicon oxide, polysilicon 1 layer and field oxide regions away where unprotected by the photo resist mask.
6. Remove the photoresist and the basic cell has been completed.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of forming split gate electrode MOSFET devices including the steps comprising:

form a tunnel oxide layer over a semiconductor substrate, form a floating gate electrode layer composed of polysilicon over said tunnel oxide layer, form a masking cap comprising a hard mask composed of polysilicon oxide over said floating gate electrode layer, pattern a floating gate electrode stack formed by said tunnel oxide layer and said floating gate electrode layer in said pattern of said masking cap using said masking cap as a hard mask, form intermetal dielectric and control gate layers over said substrate covering said said masking cap and said stack and locations for future source regions and locations for future drain regions, pattern said intermetal dielectric and control gate layers into forming a control gate set covering said masking cap, and said stack, with a portion of said set remaining on said semiconductor substrate beyond the floating gate electrode stack to prepare for the formation of mirror image split gate electrodes, etch a source line slot bisecting and extending through said set, said masking cap, and said stack to form a mirror image split gate electrode pair and stacks pairs, form a source region by ion implanting through said source line slot through said gate electrode stack including said floating gate electrode and said tunnel oxide layer, and form a drain region self-aligned with said split gate electrodes.

2. The method of claim 1 including the steps as follows:

form said floating gate electrode of a doped polysilicon layer, and pattern said tunnel oxide layer and said floating gate electrode layer in a subtractive process using said cap as a mask.

3. The method of claim 1 including the steps as follows:

form said floating gate electrode of a doped polysilicon layer, form a silicon nitride floating gate mask over said polysilicon layer, and form said masking cap on the surface of said doped polysilicon by forming a polysilicon oxide cap on the surface of said polysilicon layer exposed through the silicon nitride floating gate mask, strip said silicon nitride floating gate mask, and pattern said tunnel oxide layer and said floating gate electrode layer in a subtractive process using said cap as a mask.

4. The method of claim 1 including the steps as follows:

form said floating gate electrode of a doped polysilicon layer, form a silicon nitride floating gate mask over said polysilicon layer, and form said masking cap on the surface of said doped polysilicon by forming a polysilicon oxide cap on the surface of said polysilicon layer, and etch said tunnel oxide layer and said floating gate electrode layer using said cap as a mask to form said floating gate electrode.

5. The method of claim 1 the steps as follows:

form FOX regions and then form active regions in said substrate prior to forming said tunnel oxide layer, form said floating gate electrode of a doped polysilicon layer, form a silicon nitride floating gate mask over said polysilicon layer, form said masking cap on the surface of said doped polysilicon by forming a polysilicon oxide cap on the surface of said polysilicon layer exposed through the silicon nitride floating gate mask, strip said silicon nitride floating gate mask, and etch said tunnel oxide layer and said floating gate electrode layer using said cap as a mask to form said floating gate electrode.

6. A method of forming split gate electrode MOSFET devices including the steps comprising:

form a tunnel oxide layer over a semiconductor substrate, form a polysilicon floating gate electrode layer formed of polysilicon over said tunnel oxide layer, form a masking cap comprising a hard mask composed of polysilicon oxide over said floating gate electrode layer, pattern a gate electrode stack formed by said tunnel oxide layer and said floating gate electrode layer in said pattern of said masking cap, form intermetal dielectric and control gate layers over said substrate covering said masking cap and said stack and locations for future source regions and locations for future drain regions, pattern said intermetal dielectric and control gate layers into a a control gate electrode set covering said masking cap, said stack with a portion of said set remaining on said semiconductor substrate to prepare for formation of mirror image split gate electrodes, pattern a source line slot in the center of said gate electrode stack down to said substrate extending through said set, said masking cap, and said stack to form a split gate electrode pair over a corresponding floating gate electrode stack pair, form a source region self-aligned with said source line slot, and form a drain region self-aligned with said split gate electrodes.

7. The method of claim 6 including the steps comprising:

form said floating gate electrode of a doped polysilicon layer, and form said masking cap on the surface of said doped polysilicon by forming a polysilicon oxide cap, and pattern said tunnel oxide layer and said floating gate electrode layer in a subtractive process using said cap as a mask.

8. The method of claim 6 including the steps comprising:

form said floating gate electrode of a doped polysilicon layer, form a silicon nitride floating gate mask over said polysilicon layer, form said masking cap on the surface of said doped polysilicon by forming a polysilicon oxide cap on the surface of said polysilicon layer, exposed through the silicon nitride floating gate mask, strip said silicon nitride floating gate mask, and pattern said tunnel oxide layer and said floating gate electrode layer in a subtractive process using said cap as a mask.

9. The method of claim 6 including the steps comprising:

form said floating gate electrode of a doped polysilicon layer, form a silicon nitride floating gate mask over said polysilicon layer, form said masking cap on the surface of said doped polysilicon by forming a polysilicon oxide cap on the surface of said polysilicon layer exposed through the silicon nitride floating gate mask, strip said silicon nitride floating gate mask, and etch said tunnel oxide layer and said floating gate electrode layer using said cap as a mask to form said floating gate electrode.

10. The method of claim 6 including the steps comprising:

form long FOX regions and then form active regions in said substrate prior to forming said tunnel oxide layer, form said floating gate electrode of a doped polysilicon layer, form a silicon nitride floating gate mask over said polysilicon layer, form said masking cap on the surface of said doped polysilicon by forming a polysilicon oxide cap on the surface of said polysilicon layer exposed through the silicon nitride floating gate mask, strip said silicon nitride floating gate mask, etch said tunnel oxide layer and said floating gate electrode layer using said cap as a mask to form said floating gate electrode, and said slot having a width from about 3500 Å to about 6500 Å.

* * * * *